(12) United States Patent
Li et al.

(10) Patent No.: US 11,009,741 B2
(45) Date of Patent: May 18, 2021

(54) COLOR FILTER STRUCTURE AND METHOD OF FABRICATING SAME

(71) Applicant: SHENZHEN CHINA STAR OPTOELECTRONICS SEMICONDUCTOR DISPLAY TECHNOLOGY CO., LTD., Guangdong (CN)

(72) Inventors: Xianglong Li, Guangdong (CN); Tsungyuan Wu, Guangdong (CN); Yuanchun Wu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/613,056

(22) PCT Filed: Oct. 23, 2019

(86) PCT No.: PCT/CN2019/112823
§ 371 (c)(1),
(2) Date: Nov. 12, 2019

(87) PCT Pub. No.: WO2021/035920
PCT Pub. Date: Mar. 4, 2021

(65) Prior Publication Data
US 2021/0063810 A1    Mar. 4, 2021

(30) Foreign Application Priority Data

Aug. 26, 2019  (CN) .......................... 201910789405.0

(51) Int. Cl.
*H01L 27/32* (2006.01)
*G02F 1/1335* (2006.01)

(52) U.S. Cl.
CPC .. *G02F 1/133516* (2013.01); *G02F 1/133512* (2013.01); *H01L 27/322* (2013.01)

(58) Field of Classification Search
CPC ......... G02F 1/133516; G02F 1/133512; H01L 27/322
See application file for complete search history.

(56) References Cited

U.S. PATENT DOCUMENTS

| | | | |
|---|---|---|---|
| 2004/0189895 A1* | 9/2004 | Chen ................. | G02F 1/133514 349/106 |
| 2008/0175981 A1* | 7/2008 | Suzuki .............. | G02F 1/133711 427/58 |
| 2014/0218663 A1* | 8/2014 | Stahl ..................... | B42D 25/45 349/86 |

* cited by examiner

*Primary Examiner* — Donald L Raleigh

(57) ABSTRACT

The invention provides a color filter structure and a method of fabricating the same, the color filter structure including: a plurality of color filter units, wherein each of the plurality of color filter units has a longitudinal section of a circular arc shape or a polygonal arc shape.

13 Claims, 3 Drawing Sheets

COLOR FILTER STRUCTURE AND METHOD OF FABRICATING SAME

BACKGROUND OF INVENTION

Field of Invention

The present invention relates to a display, in particular to a novel color filter structure capable of improving color shift phenomenon and a method of fabricating the same.

Description of Prior Art

Display technology has been widely used in life, from small-size, high-resolution wearable virtual-reality/augmented-reality (VR/AR) devices to large-size, high-brightness outdoor displays, from flat panel display to curved display and further to stereoscopic display. Applications of display technology are ubiquitous. At present, the most widely used technology for video scenes is liquid crystal display (LCD), and an organic electroluminescent diode (OLED) is also rapidly developed and widely used. Among these two display technologies, color filters (CFs) are indispensable key components.

The most common scene is that the color filter is responsible for converting white light into three primary colors of red, green, and blue colors, which are then combined into colorful colors that we see on the display. The color filter is usually prepared on a glass substrate and corresponds to a pixel on a backplate with a thin film transistor to convert light to a target color. The color filter is usually directly coated and patterned on a substrate. However, the color filter obtained by this method has a uniform thickness in a vertical viewing angle, as shown in FIG. 1. FIG. 1 is a schematic diagram of a conventional color filter. Referring to FIG. 1, in the conventional color filter 100, although a film thickness in a vertical viewing angle is constant, the film thickness of the color filter at different viewing angles will be varied with a variation of the viewing angle. Color conversion ability of the color filter will be varied with an increase of its thickness. Especially, a transmission spectrum of the color filter will be varied significantly as its thickness increases. In such cases, color conversion ability of the color filter will be varied at different viewing angles. Thus, color shifting will occur at different viewing angles.

In order to solve the color shift phenomenon caused by the difference in color conversion ability of a color filter at different viewing angles, there is an urgent need to develop a novel color filter having a uniform film thickness at different viewing angles to solve the color shift phenomenon.

SUMMARY OF INVENTION

In view of above, the present invention provides a novel color filter, a method of fabricating the same, and a display using the same. The color filter provided by the present invention can reduce impact on color improvement and brightness caused by a film thickness of the color filter at different viewing angles, thereby improving its color characteristics and brightness characteristics at different viewing angles, thus solving the color shift phenomenon of the display.

Accordingly, in accordance with an embodiment of the present invention, the present invention provides a color filter, including: a plurality of color filter units, wherein each of the plurality of color filter units has a longitudinal section of a circular arc shape or a polygonal arc shape.

In an embodiment of the present invention, the color filter structure further includes a plurality of black matrices correspondingly disposed between the plurality of color filter units respectively.

According to another embodiment of the present invention, the present invention also provides a method of fabricating a color filter, which includes forming a color filter by at least one of inkjet printing, blade coating, stamping, transfer, and pulling, wherein the color filter includes a plurality of color filter units adjoining each other, the plurality of color filter units having similar film thicknesses ranging from 0.1 um to 10 um in a radial direction.

According to another embodiment of the present invention, the present invention further provides a display including the color filter structure.

According to still another embodiment of the present invention, the present invention further provides a method of fabricating a color filter, including: S10 providing a first substrate, wherein a longitudinal section of a surface of the first substrate includes a plurality of regularly arranged circular or polygonal arcs which are concave or convex; S20 coating a wet color filter on the first substrate; S30 providing a second substrate, wherein a longitudinal section of a surface of the second substrate includes a plurality of regularly arranged circular or polygonal arcs which are convex or concave, and imprinting the wet color filter by aligning the concave-convex arcs between the first substrate and the second substrate, such that the wet color filter is formed into a color filter; S40 curing the color filter; S50 separating the cured color filter from the first substrate and the second substrate, wherein the separated color filter includes a plurality of color filter units adjoining each other.

In an embodiment of the present invention, the plurality of color filter units have similar film thicknesses in a radial direction, and the film thicknesses may range from 0.1 um to 10 um.

In an embodiment of the present invention, the curing of the color filter in the step S40 is performed by at least one of thermal curing and ultraviolet curing.

In an embodiment of the present invention, the curing of the color filter in the step S40 is performed at a temperature ranging from 100° C. to 250° C. for 1-120 minutes.

The present invention provides a novel color filter, a method of fabricating the same, and a display using the same. The color filter provided by the present invention can reduce impact on color improvement and brightness caused by a film thickness of the color filter at different viewing angles, thereby improving its color characteristics and brightness characteristics at different viewing angles, thus solving the color shift phenomenon of the display.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

In order to make the above description of the present invention more comprehensible, the preferred embodiments are described below in detail with reference to the accompanying drawings.

The following description of the various embodiments is provided to illustrate the specific embodiments of the invention. The spatially relative directional terms mentioned in the present invention, such as "vertical", "horizontal", "upper", "lower", "before", "after", "left", "right", "inside", "outside", "side", etc. and the like, may be used herein for ease of description to describe one element or feature's relationship to another element(s) or feature(s) as illustrated in the figures which are merely references. The spatially relative terms are intended to encompass different orientations in addition to the orientation as depicted in the figures.

In order to solve the color shift phenomenon caused by the difference in color conversion ability of a color filter at different viewing angles, the present invention provides a novel color filter, which can reduce impact on color improvement and brightness caused by a film thickness of the color filter at different viewing angles, thereby improving its color characteristics and brightness characteristics at different viewing angles, thus solving the color shift phenomenon of the display.

Figure 1:
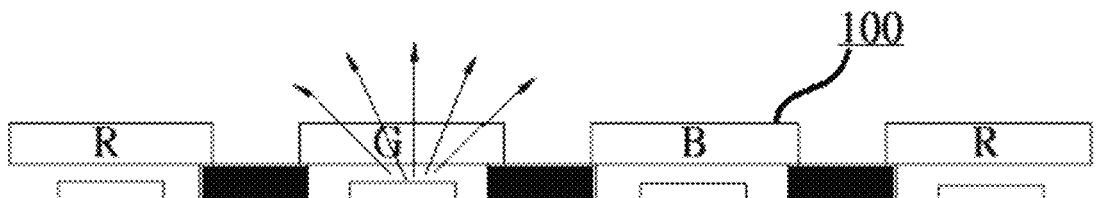
FIG. 1 is a schematic diagram of a conventional color filter.
Figure 2:
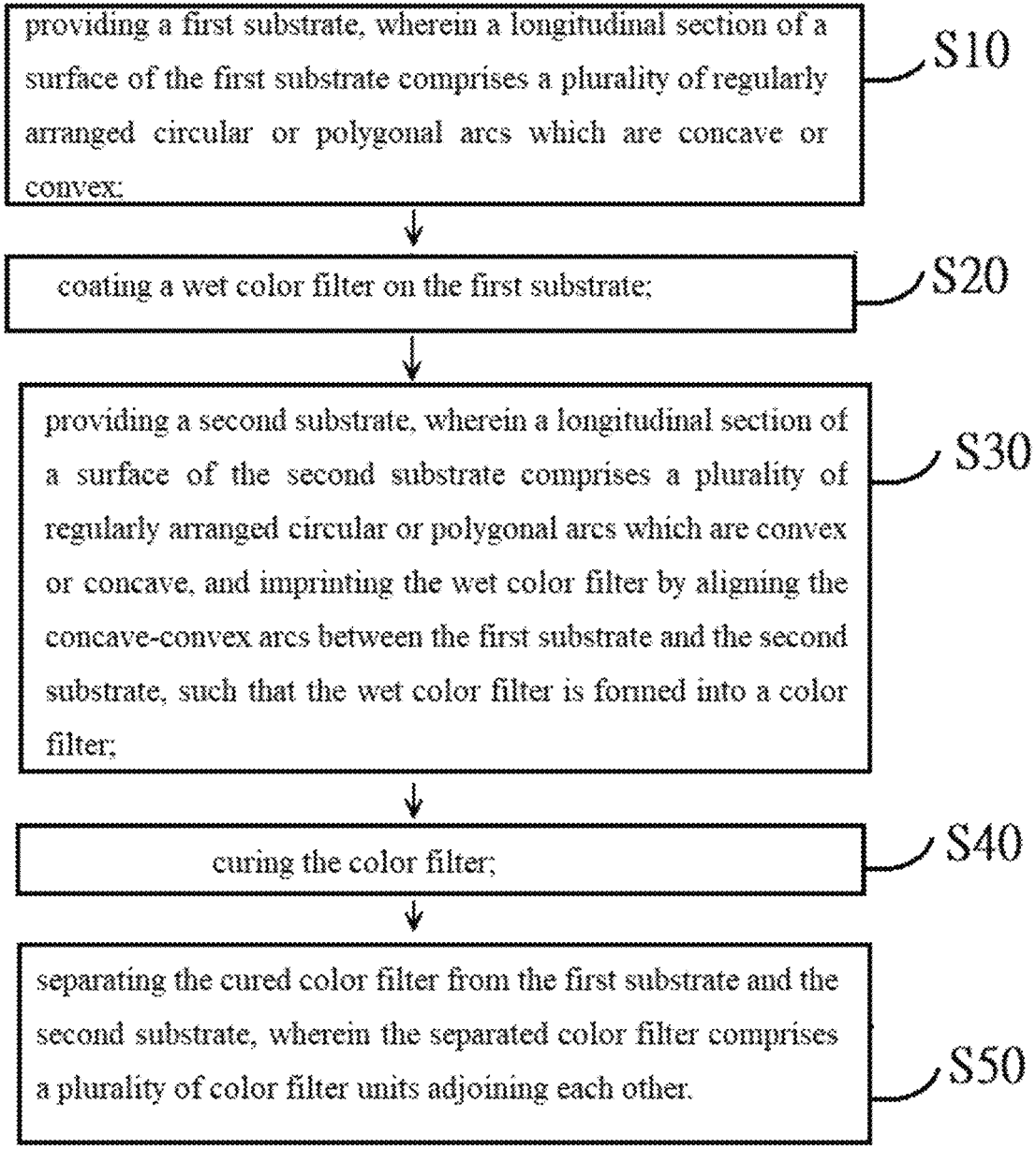
FIG. 2 is a flow chart of a method of fabricating a color filter according to an embodiment of the present invention.

Accordingly, the present invention provides a method of fabricating a color filter, as shown in FIG. 2. FIG. 2 is a flow chart of a method of fabricating a color filter according to an embodiment of the present invention. As shown in FIG. 2, in particular, a method of fabricating a color filter according to an embodiment of the present invention includes: S10 providing a first substrate, wherein a longitudinal section of a surface of the first substrate includes a plurality of regularly arranged circular or polygonal arcs which are concave or convex; S20 coating a wet color filter on the first substrate; 30 providing a second substrate, wherein a longitudinal section of a surface of the second substrate includes a plurality of regularly arranged circular or polygonal arcs which are convex or concave, and imprinting the wet color filter by aligning the concave-convex arcs between the first substrate and the second substrate, such that the wet color filter is formed into a color filter; S40 curing the color filter; and S50 separating the cured color filter from the first substrate and the second substrate, wherein the separated color filter includes a plurality of color filter units adjoining each other.

Figure 3:
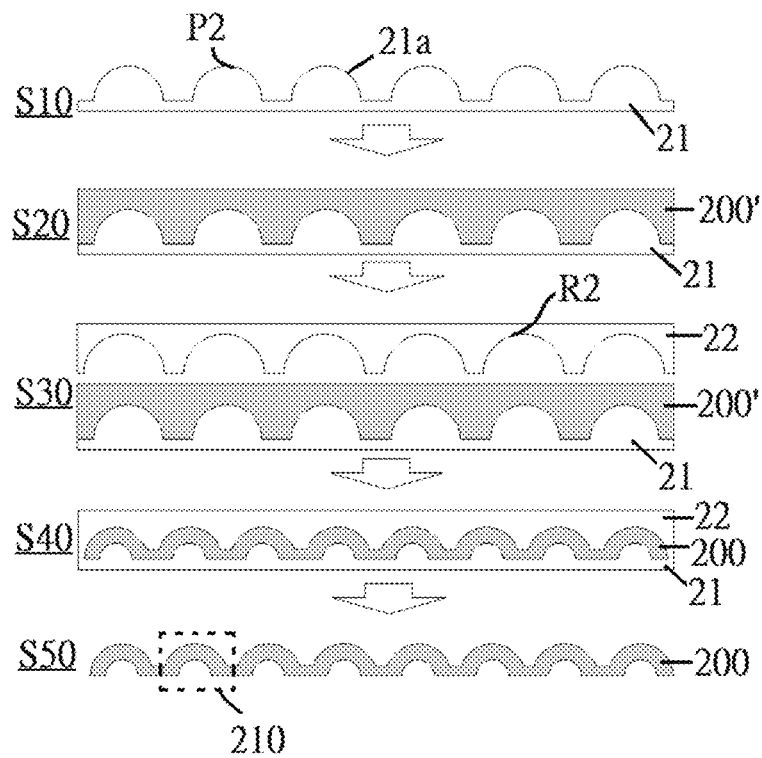
FIG. 3 is a schematic diagram of fabricating a color filter according to an embodiment of the present invention.

In an embodiment of the method of fabricating the color filter of the present invention, FIG. 3 shows a schematic structural diagram of each step, that is, FIG. 3 is a schematic diagram of fabricating a color filter according to an embodiment of the present invention. As shown in FIG. 3, in particular, the method of fabricating a color filter according to an embodiment of the present invention includes: S10 providing a first substrate 21, wherein a longitudinal section of a surface 21a of the first substrate 21 includes a plurality of regularly arranged circular or polygonal arcs P2 which are convex; S20 coating a wet color filter 200' on the first substrate 21; S30 providing a second substrate 22, wherein a longitudinal section of a surface of the second substrate includes a plurality of regularly arranged circular or polygonal arcs R2 which are concave, and imprinting the wet color filter 200' by aligning the convex-concave arcs P2-R2 between the first substrate 21 and the second substrate 22, such that the wet color filter 200' is formed into a color filter 200; S40 curing the color filter 200; and S50 separating the cured color filter 200 from the first substrate 21 and the second substrate 22, wherein the separated color filter 200 includes a plurality of color filter units 210 adjoining each other.

Figure 4:
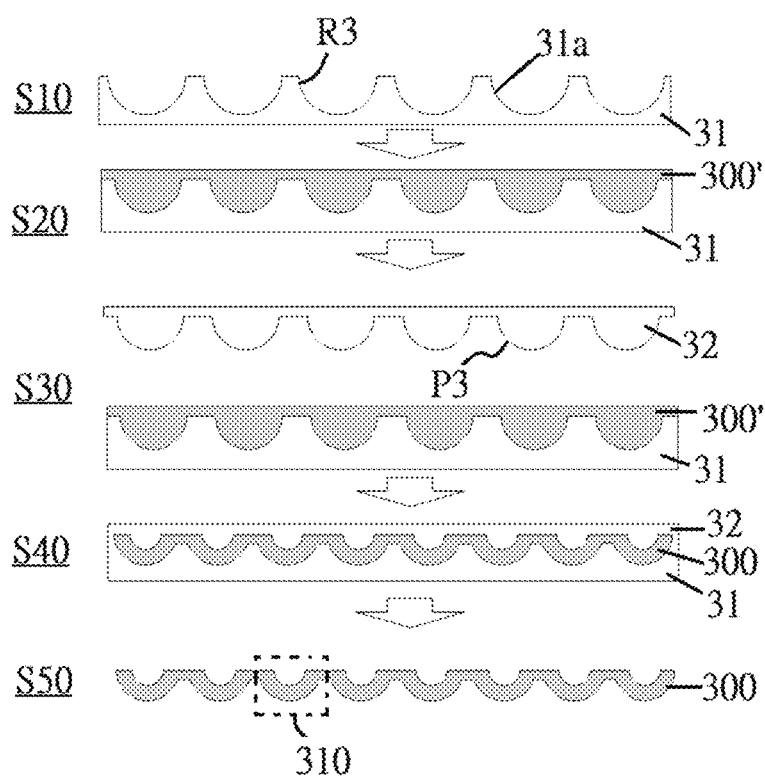
FIG. 4 is a schematic diagram of fabricating a color filter according to another embodiment of the present invention.

In another embodiment of the method of fabricating a color filter of the present invention, FIG. 4 shows a schematic structural diagram of each step, that is, FIG. 4 is a schematic diagram of fabricating a color filter according to an embodiment of the present invention. As shown in FIG. 4, in particular, a method of fabricating a color filter according to an embodiment of the present invention includes: S10 providing a first substrate 31, wherein a longitudinal section of a surface 31a of the first substrate 31 includes a plurality of regularly arranged circular or polygonal arcs P3 which are concave; S20 coating a wet color filter 300' on the first substrate 31; S30 providing a second substrate 32, wherein a longitudinal section of a surface of the second substrate 32 includes a plurality of regularly arranged circular or polygonal arcs R3 which are convex, and imprinting the wet color filter 200' by aligning the concave-convex arcs P3-R3 between the first substrate 31 and the second substrate 32, such that the wet color filter 300' is formed into a color filter 300; S40 curing the color filter 300; and S50 separating the cured color filter 300 from the first substrate 31 and the second substrate 32, wherein the separated color filter 300 includes a plurality of color filter units 310 adjoining each other.

In the above embodiments, the curing of the color filter in the step S40 is performed by at least one of thermal curing and ultraviolet curing.

In the above embodiment, the curing of the color filter in the step S40 is performed at a temperature ranging from 100° C. to 250° C. for 1-120 minutes.

Figure 5:
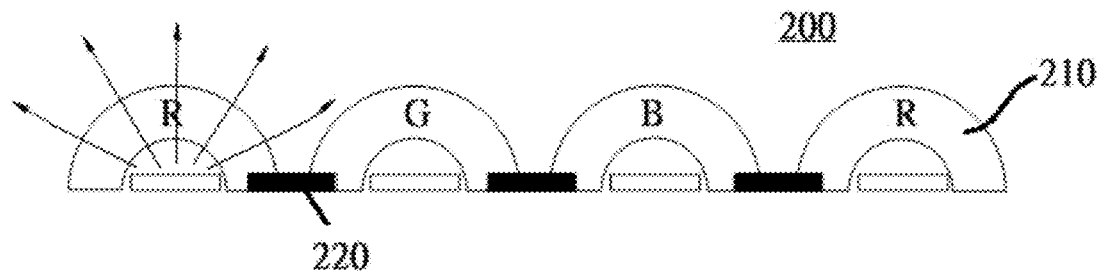
FIG. 5 is a schematic diagram of a color filter according to an embodiment of the present invention.

In addition to the above-described embodiments, the color filter of the present invention may also be formed by at least one of inkjet printing, blade coating, embossing, transfer, and pulling, and the obtained color filter has a structure as shown in FIG. 5. FIG. 5 is a schematic diagram of a color filter in accordance with an embodiment of the present invention.

As shown in FIG. 5, the color filter 200 provided by the embodiment of the present invention includes: a plurality of color filter units 210, wherein each of the plurality of color filter units 210 has a longitudinal section of a circular arc shape or a polygonal arc shape. The color conversion ability of the color filter having a longitudinal section of a multiple circular arc shape or a multiple polygonal arcs shape of the invention is not varied at different viewing angles, thereby achieving the object of reducing color deviation caused by variations in its film thickness when the viewing angle is varied.

In addition, specific implementation methods and means of the present invention to provide a color filter having a uniform film thickness at different viewing angles may further include combining various color filters, and forming color filters of different colors or thicknesses by repeating the above concepts and methods of the present invention, which is not particularly limited to the embodiments of the present invention, and can be designed by a person skilled in the art according to the actual requirements of the product. Still referring to FIG. 5, in an embodiment of the present invention, the color filter 200 further includes a plurality of black matrices 220 correspondingly disposed between the plurality of color filter units 210 respectively.

As shown in FIG. 5, in an embodiment of the present invention, the plurality of color filter units 210 have identical or similar film thicknesses in a radial direction, and the film thicknesses range from 0.1 to 10 um.

The color conversion ability of the novel color filter provided by the present invention is not varied at different viewing angles. Through the descriptions of the above embodiments, an object of the present invention is to reduce the color deviation caused by variations in its film thickness when the viewing angle is varied. As long as the above object can be achieved, there is no need to particularly limit the implementation methods and means of providing a color filter having a uniform film thickness at different viewing angles. For example, it is not particularly limited whether various color films are combined, or whether color filters of different colors or thicknesses are formed by repeating the above concepts and methods of the present invention, and can be designed by an engineer according to the actual requirements of the product.

The present invention provides a color filter with a uniform film thickness at different viewing angles, which can be applied to scenes of display including organic light emitting diode (OLED) display, quantum light emitting diode (QLED) display, micro light emitting diode (micro-LED) display, or liquid crystal display (LCD) display. The description and parameters in the embodiments are intended to assist a reader in understanding the basic idea of the design of the present invention, but the scope of the present invention is not limited to such statements, parameter examples and embodiments.

Figure 6:
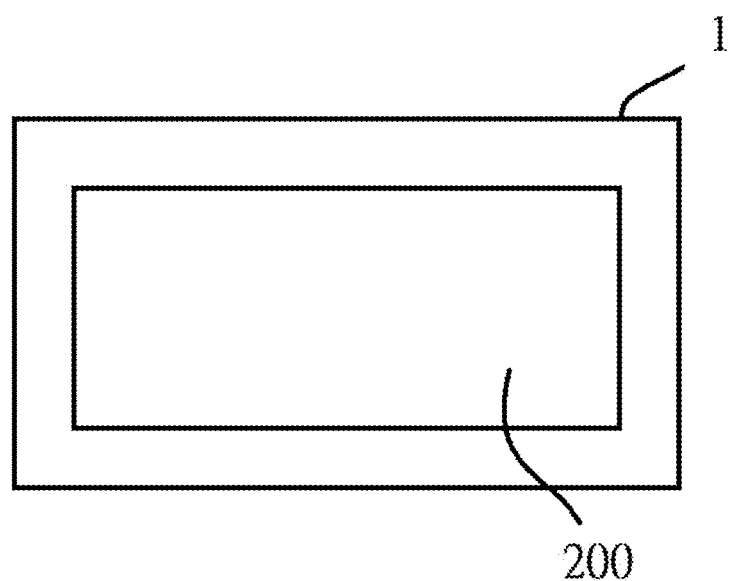
FIG. 6 is a schematic diagram of a display in accordance with an embodiment of the present invention.

Referring to FIG. 6, another embodiment of the present invention also provides a display 1 including a color filter structure 200 of the present invention. The display may be selected from at least one of an organic light emitting diode display (OLED), a quantum dot light emitting diode (QLED) display, a micro light emitting diode (micro-LED) display, and a liquid crystal display (LCD). By introducing the color filter structure of the present invention, impact on a color improvement and brightness caused by a film thickness of the color filter at different viewing angles can be reduced, thereby improving the color characteristics and brightness characteristics at different viewing angles, thus solving the color shift phenomenon of the display.

Accordingly, the present invention provides a novel color filter, a method of fabricating the same, and a display using the same. The color filter provided by the present invention can reduce impact on color improvement and brightness caused by a film thickness of the color filter at different viewing angles, thereby improving its color characteristics and brightness characteristics at different viewing angles, thus solving the color shift phenomenon of the display.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A color filter structure, comprising a plurality of color filter units, wherein each of the plurality of color filter units has a longitudinal section having a top contour and a bottom contour which are both a circular arc shape or a polygonal arc shape in a cross-sectional view of each of the plurality of color filter units.

2. The color filter structure according to claim 1, wherein the plurality of color filter units have identical or similar film thicknesses in a radial direction.

3. The color filter structure according to claim 2, wherein the film thicknesses range from 0.1 to 10 um.

4. The color filter structure according to claim 1, further comprising a plurality of black matrices correspondingly disposed between the plurality of color filter units respectively.

5. A display, comprising the color filter structure of claim 1.

6. A method of fabricating a color filter structure, comprising:
   S10 providing a first substrate, wherein a longitudinal section of a surface of the first substrate comprises a plurality of regularly arranged circular or polygonal arcs which are concave or convex;
   S20 coating a wet color filter on the first substrate;
   S30 providing a second substrate, wherein a longitudinal section of a surface of the second substrate comprises a plurality of regularly arranged circular or polygonal arcs which are convex or concave, and imprinting the wet color filter by aligning the concave-convex arcs between the first substrate and the second substrate, such that the wet color filter is formed into a color filter;
   S40 curing the color filter; and
   S50 separating the cured color filter from the first substrate and the second substrate, wherein the separated color filter comprises a plurality of color filter units adjoining each other.

7. The method of fabricating the color filter structure according to claim 6, wherein the plurality of color filter units have identical or similar film thicknesses in a radial direction.

8. The method of fabricating the color filter structure according to claim 7, wherein the film thicknesses range from 0.1 to 10 um.

9. The method of fabricating a color filter structure according to claim 6, wherein the curing of the color filter in the step S40 is performed by at least one of thermal curing and ultraviolet curing.

10. The method for fabricating a color filter structure according to claim 6, wherein the curing of the color filter in the step S40 is performed at a temperature ranging from 100° C. to 250° C. for 1-120 minutes.

11. A method of fabricating a color filter structure, comprising:
   S10 providing a first substrate, wherein a longitudinal section of a surface of the first substrate comprises a plurality of regularly arranged circular or polygonal arcs which are concave or convex;
   S20 coating a wet color filter on the first substrate;
   S30 providing a second substrate, wherein a longitudinal section of a surface of the second substrate comprises a plurality of regularly arranged circular or polygonal arcs which are concave or convex, and imprinting the wet color filter by aligning the concave-convex arcs between the first substrate and the second substrate, such that the wet color filter is formed into a color filter;
   S40 curing the color filter; and
   S50 separating the cured color filter from the first substrate and the second substrate, wherein the separated color filter comprises a plurality of color filter units adjoining each other, the plurality of color filter units have identical or similar film thicknesses in a radial direction, and the film thicknesses range from 0.1 to 10 um.

12. The method of fabricating a color filter structure according to claim 11, wherein the curing of the color filter in the step S40 is performed by at least one of thermal curing and ultraviolet curing.

13. The method for fabricating a color filter structure according to claim 11, wherein the curing of the color filter in the step S40 is performed at a temperature ranging from 100° C. to 250° C. for 1-120 minutes.

* * * * *